United States Patent [19]

Komatsu et al.

[11] 4,439,749
[45] Mar. 27, 1984

[54] ELECTRONIC TUNING BLOCK

[75] Inventors: Hiroaki Komatsu; Kenji Yoshioka, both of Miyagi, Japan

[73] Assignee: Alps Electric Co., Ltd., Tokyo, Japan

[21] Appl. No.: 363,471

[22] Filed: Mar. 30, 1982

[30] Foreign Application Priority Data

Mar. 31, 1981 [JP] Japan ................................ 56-46204

[51] Int. Cl.³ .......................... H03J 1/06; H03J 1/08
[52] U.S. Cl. ...................................... 334/7; 74/10.85;
116/248; 334/15; 334/87; 334/89; 338/128;
338/180; D14/96
[58] Field of Search ................... 334/7, 15, 85, 86, 87,
334/89; 338/128, 135, 180, 181, 197; 235/106,
110, 145 R; 74/10.85; D14/37, 75, 96, 5, 6,
70-72; 455/154, 155, 157, 170, 175; 116/248

[56] References Cited

U.S. PATENT DOCUMENTS 288,976 11/1883 Chambers, Jr. ..................... 235/110
1,385,256 7/1921 McCann ...................... 235/145 R X Primary Examiner—Paul L. Gensler
Attorney, Agent, or Firm—Guy W. Shoup; Gerard F. Dunne

[57] ABSTRACT

An electronic tuning block including a plurality of screw drive type variable resistors are juxtaposed parallel to one another obliquely on an insulating substrate, and holes for receiving pointers fitted to the screws of the variable resistors and holes for receiving rotary knobs fitted to the tips of the screw shaft are formed on the upper surface of a box-shaped insulating case which is fixed to the insulating substrate.

1 Claim, 7 Drawing Figures

Fig. 1a
PRIOR ART
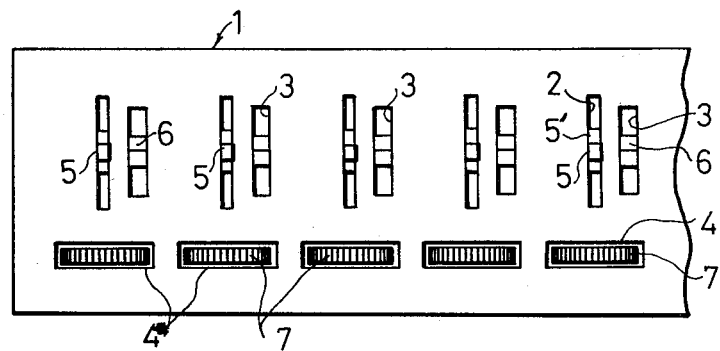
Fig. 1b
PRIOR ART
Fig. 1c
PRIOR ART
Fig. 2a
PRIOR ART
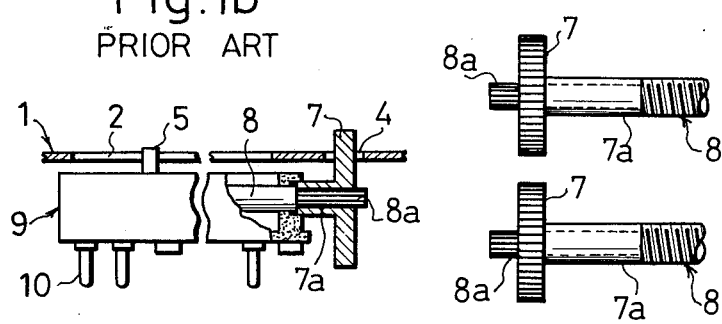

ELECTRONIC TUNING BLOCK

BACKGROUND OF THE INVENTION

This invention relates to an electronic tuning block including a plurality of variable resistors for setting a preset voltage for use in an electronic tuning type television receiver or the like. More particularly, the present invention is directed to an electronic tuning block in which the arrangement of a plurality of screw drive type variable resistors on an insulating substrate is improved in order to reduce their space requirements and to reduce possible erroneous operation of the variable resistors.

Electronic tuning blocks of this kind are known and as schematically illustrated in FIGS. 1a through 1c typically include a box-shaped case 1 made of an insulating synthetic resin having its open lower surface fixed to an insulating substrate (not shown). Rectangular holes 2, 3 and 4 are formed on the upper surface of this case 1. Pointers 5 are fitted within the holes 2. As shown in FIG. 1b, these pointers 5 are movable integrally with sliders fitted to screw shafts 8 of variable resistors 9. The holes 3 guide and receive knobs 6 of slide switches for changing the frequency bands of the tuner, while the holes 4 receive rotary knobs 7 that are fitted to the end portions 8a of the screw shafts 8 of the variable resistors 9. Reference numeral 7a represents a sleeve which is integral with each knob 7 and reference numeral 10 denotes terminals.

According to the construction of such known devices, the variable resistors 9 are spaced equally and lie across the insulating substrate with their knobs 7 aligned on the same line. In order to insure smooth knob operation, therefore, a predetermined gap must be maintained between an adjacent pair of knobs 7, thus increasing the space needed along the insulating substrate in its longitudinal direction to accommodate the resistors 9. According to this arrangement, the adjacent knobs 7 are positioned in the path of movement of a finger that is operating the desired knob and, consequently, the knob adjacent the desired knob is likely to be erroneously manipulated.

To solve this problem, another construction has been proposed in which the positions of the rotary knobs 7 of the adjacent variable resistors 9 are deviated from one another and the knobs 7 are staggered in two lines so that parts thereof overlap with one another to reduce the space requirements, as illustrated in FIGS. 2a and 2b. In this case, however, two kinds of knobs 7 become necessary, one having a long sleeve 7a and the other, a shorter sleeve 7a'. This lowers productivity. In addition, since the knobs are aligned in two lines adjacent one another with parts thereof overlapping adjacent knobs 7 are still positioned in the path of movement of a finger operating a knob, and the desired knob is difficult to operate and the adjacent knobs are likely to be erroneously operated.

SUMMARY OF THE INVENTION

The present invention is therefore directed to provide an electronic tuning block which eliminates all the above-mentioned problems with the prior art, has a reduced space requirement and is capable of preventing the adjacent knob from being erroneously operated.

These and other objects and features of the invention will become more apparent from the following description taken in connection with the accompanying drawings.

BRIEF DESCRIPTION OF THE DRAWINGS

FIG. 1 illustrates an example of the prior art device in which FIG. 1a is a top view of the electronic tuning block and FIGS. 1b and 1c are sectional views of its principal portions.

FIG. 2 also illustrates another example of the prior art device in which FIG. 2a is a top view of the electronic tuning block and FIG. 2b is a schematic view of the rotary knob.

FIG. 3 illustrates an embodiment of the present invention in which

DESCRIPTION OF THE PREFERRED EMBODIMENTS

Figure 3A:
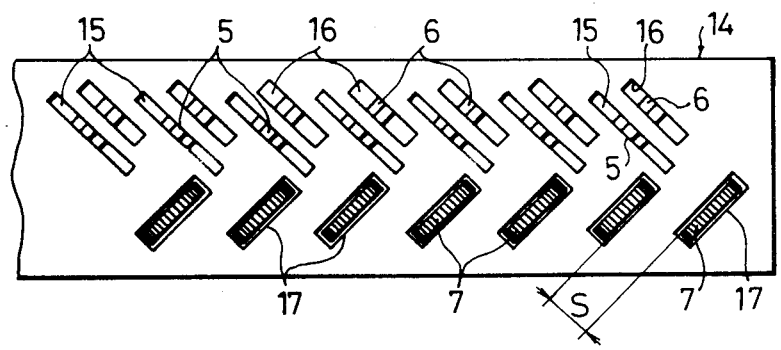
FIG. 3a is a top view of the electronic tuning block of the present invention and FIG. 3b is a top view showing the insulating substrate and the variable resistors.
Figure 3B:
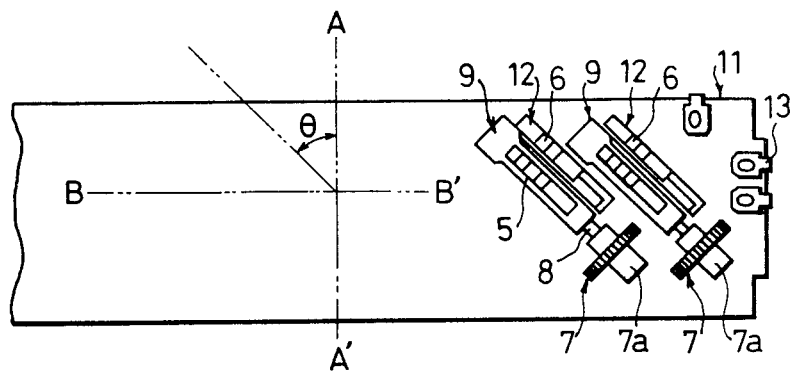

Hereinafter, preferred embodiments of the present invention will be described with reference to FIGS. 3a and 3b, in which like reference numerals are employed to identify like constituents as in the prior art devices.

In the drawings, reference numeral 11 represents a rectangular insulating substrate and variable resistors 9 each equipped with a slide switch 12, are fitted to the upper surface of the substrate 11. These resistors are equally spaced from one another in parallel arrangement at a predetermined angle $\theta$ of inclination between 0° and 90° with respect to the line A—A' extending transversely across the insulating substrate in the direction of its width. The rotary knobs 7 are located on a line parallel to the line B—B' extending longitudinally along the insulating substrate in the direction of its length, as shown in FIG. 3b. Each variable resistor 9 is fitted to the insulating substrate 11 by inserting its terminals into small apertures (not shown) formed in the insulating substrate 11 and then soldering the terminals to an electroconductive pattern on the back of the substrate 11. To reduce the requirements of the device, the gaps between the variable resistors 9 are reduced as much as possible. In FIG. 3b, reference numeral 13 represents a terminal that is fitted to the insulating substrate 11.

Reference numeral 14 represents a substantially box-shaped case made of an insulating synthetic resin and the open end of its lower surface is fixed to the insulating substrate 11 by suitable fixing means. Reference numerals 15, 16 and 17 represent holes formed on the upper surface of the case 14 to receive the aformentioned pointers 5, knobs 6 of the slide switches 12 and rotary knobs 7, respectively. The holes 15, 16 are formed so as to describe an angle $\theta$ with respect to the abovementioned line A—A' while the holes 17 are formed so as to cross the holes 15, 16 at a right angle.

In the assembled state, the pointers 5 and the knobs 6 are slidably fitted into and guided by the holes 15 and 16, respectively, and the frequency bands can be changed by the knobs 6 protruding from the holes 17. The pointers 5, that are integrally driven with the aformentioned sliders, let the set resistance value (the preset voltage, that is the turning frequency corresponding to the preset voltage) visible from the upper surface of the case 14. Each rotary knob 7 protruding in a predetermined distance from the hole 17 is disposed with a predetermined gap S in the direction of the rotating operation and the direction crossing it, though the variable resistors 9 are disposed close to one another. When this rotary knob 7 is rotated by fingers or the like, the resistance of the corresponding variable resistor 9 is changed.

Figure 2B:
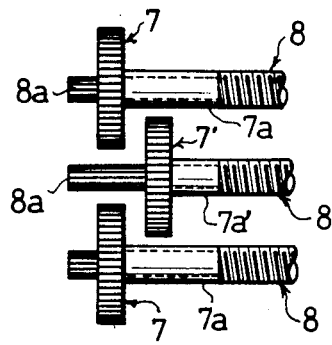

In this case, since no adjacent rotary knob 7 is placed in the path of movement of a finger actuating a given rotary knob 7 and since the gap S is disposed between a given pair of rotary knobs 7, the possibility of erroneous operation of the adjacent knob 7 is remarkably reduced. Furthermore, since the variable resistors 9 equipped with the respective switches are disposed close to one another, the space requirements can be reduced and the actual fitting density can be increased in comparison with the example of the prior art shown in FIG. 1a. When compared with the example of the prior art shown in FIG. 2a, the length of the insulating substrate of this embodiment is considerably increased in the longitudinal direction but its width can be reduced. Hence, the space requirements for the present invention is substantially equal to that of the device of FIG. 2.

As described in the foregoing, in accordance with the device of this invention, the variable resistors of the screw drive type are arranged on the insulating substrate close to one another in an oblique arrangement so that the space requirements can be reduced and the rotary knobs are spaced apart from one another with the predetermined gap S between them. Furthermore, since no adjacent rotary knobs exists in the path of movement of a finger actuating any given rotary knob, the possibility is eliminated advantageously that the adjacent rotary knob is erroneously rotated during rotating of the desired rotary knob.

What is claimed is:

1. In an electronic tuning device including a generally rectangular insulating substrate and a plurality of variable resistors each mounted to said substrate and having a shaft extending outwardly therefrom to a rotary knob fixed transversely to said shaft, and a cover adapted to be mounted over said resistors and having openings for receiving portions of said rotary knobs extending therethrough whereby said rotary knobs can be rotated by movement of a finger over the portions extending through said openings, the improvement wherein said shafts are arranged in parallel on said substrate in positions oblique to the side edges thereof so that none of said rotary knobs will be in the path of movement of a finger actuating another of said rotary knobs.

* * * * *